United States Patent [19]

Krause

[11] Patent Number: 4,592,363

[45] Date of Patent: Jun. 3, 1986

[54] HIGH-FREQUENCY DEVICE FOR NUCLEAR SPIN RESONANCE APPARATUS HAVING A SURFACE COIL

[75] Inventor: Norbert Krause, Heroldsbach, Fed. Rep. of Germany

[73] Assignee: Siemens Aktiengesellschaft, Munich, Fed. Rep. of Germany

[21] Appl. No.: 665,175

[22] Filed: Oct. 26, 1984

[30] Foreign Application Priority Data

Nov. 8, 1983 [DE] Fed. Rep. of Germany ....... 3340384

[51] Int. Cl.$^4$ ................................................ A61B 5/05
[52] U.S. Cl. ..................................... 128/653; 324/322
[58] Field of Search ................ 128/653; 324/309, 318, 324/322, 300; 336/225, 227, 232

[56] References Cited

U.S. PATENT DOCUMENTS

| 3,234,454 | 2/1966 | Collins | 324/322 |
|---|---|---|---|
| 3,388,322 | 6/1968 | Anderson et al. | 324/322 |
| 3,953,789 | 4/1976 | Veeman et al. | 324/322 |
| 4,175,251 | 11/1979 | Chandler | 324/322 |
| 4,231,008 | 10/1980 | Krueger | 324/320 |
| 4,439,733 | 3/1984 | Hinshaw et al. | 324/322 |
| 4,443,760 | 4/1984 | Edelstein et al. | 324/309 |
| 4,472,683 | 9/1984 | Sekihara et al. | 324/300 |
| 4,517,516 | 5/1985 | Hill et al. | 324/318 |

FOREIGN PATENT DOCUMENTS 2404100 9/1974 Fed. Rep. of Germany ...... 324/318

OTHER PUBLICATIONS

Battocletti et al., "Clinical Applications of the Nuclear Magnetic Resonance (NMR) UMB Blood Flowmeter", Proceedings of the IEEE, vol. 67, No. 9, Sep. 1979, pp. 1359-1361.

"Second Annual Meeting of the Society of Magnetic Resonance in Medicine", Aug. 16-19, 1983, pp. 16-17, 53-54, 83-84.

Primary Examiner—Kyle L. Howell
Assistant Examiner—Ruth S. Smith
Attorney, Agent, or Firm—Kenyon & Kenyon

[57] ABSTRACT

Apparatus for generating a magnetic high-frequency field and/or for receiving corresponding high-frequency signals in a nuclear spin resonance apparatus, especially in medical technology, contains a surface coil which can be arranged within an at least partially homogeneous magnetic field region of a magnetic field which is generated by a base field magnet and is oriented along an axis, in the vicinity of a body or body part to be examined. In this apparatus, the sensitivity of the surface coil in the depth direction should be increased and be adjustable. In order to accomplish this adjustment, the surface coil has several turns which enclose each other at least partially and which are arranged at different geometrical points. Each turn preferably comprises substantially a single conductor section or of several conductor sections arranged in a group, the current flow directions being opposed to each other in mutually adjacent turns.

13 Claims, 6 Drawing Figures

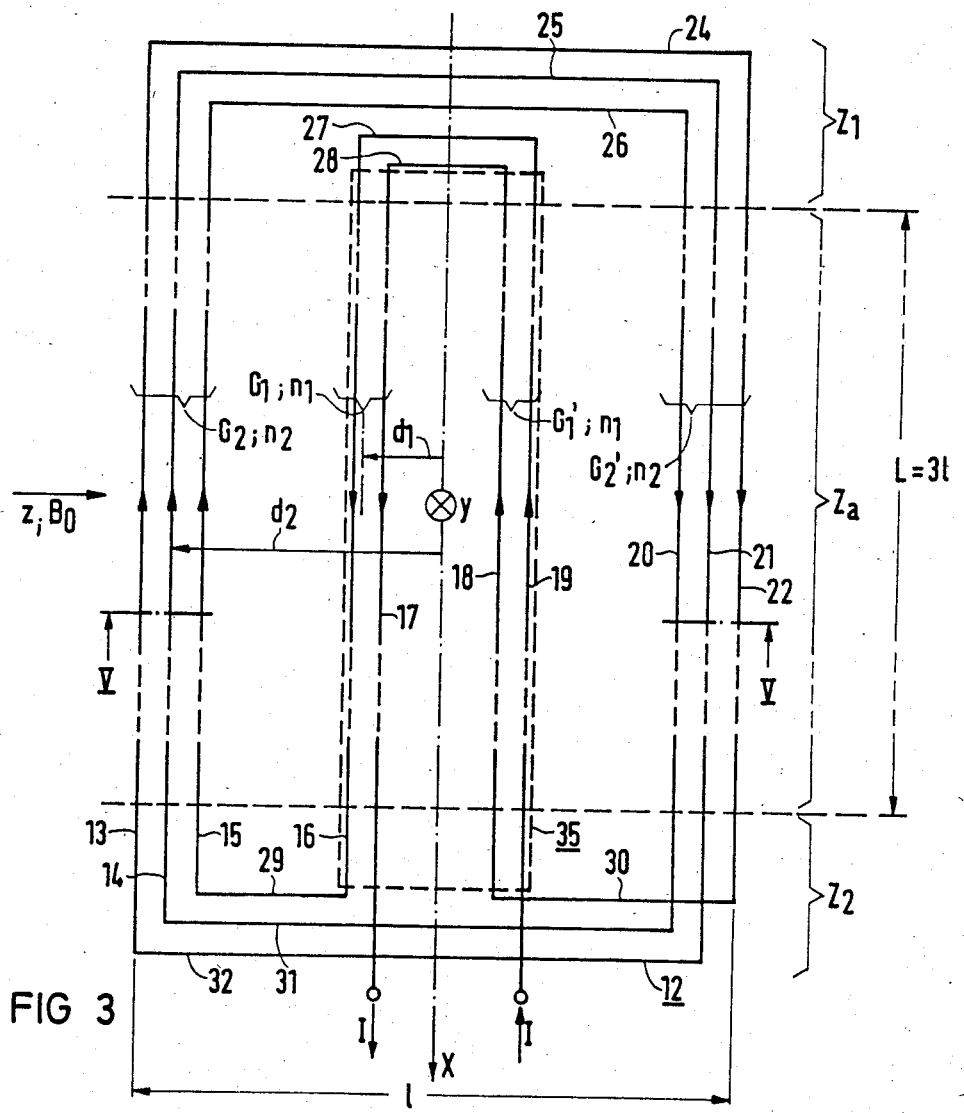
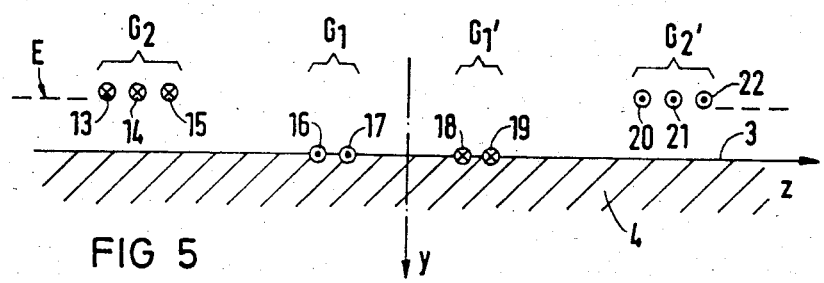
FIG 3
FIG 5

HIGH-FREQUENCY DEVICE FOR NUCLEAR SPIN RESONANCE APPARATUS HAVING A SURFACE COIL

BACKGROUND OF THE INVENTION

The present invention relates to apparatus for generating a magnetic high-frequency field and/or for receiving corresponding high-frequency signals in a nuclear spin resonance apparatus, and especially such apparatus as used in medical technology having a high-frequency surface coil which can be arranged within an at least partially homogeneous magnetic field region of a magnetic field which is generated by a base field magnet and is oriented along an axis, either directly on a body or part of the body to be examined or at least in the vicinity thereof. Such a high-frequency device is known, for instance, from reports of the "Second Annual Meeting of the Society of Magnetic Resonance in Medicine", Aug. 16 to 19, 1983, San Francisco, U.S.A. See particularly pages 16 and 17, 53 and 54 or 83 and 84.

Especially in the field of medical technology, diagnostic methods have been developed in which integral resonance signals from nuclei of a given element are analyzed by computation or measurement from the spin density distribution and/or from the relaxation time distribution of a body or part of a body to be examined. Such methods are known under the designation "Nuclear Magnetic Resonance Tomography" or "Zeugmatography". A prerequisite for nuclear spin tomography is a strong magnetic field which is generated by a so-called base field magnet, which is as homogeneous as possible in a region of predetermined extent and into which the body or part of a body to be examined is placed along an axis which generally coincides with the orientation axis of the magnetic base field. For exciting the atomic nuclei of a given element in the body into a precession motion, an additional separate coil is required, by which a high-frequency a-c field (RF a-c field) can be generated for a short time and which can also serve for receiving the RF signals associated therewith unless a separate measuring coil is provided. Optionally, the base field can also be varied locally in order to limit the region which is excited by the high-frequency signal of the surface coil (topological NMR; sensitive point method).

For special apparatus by which, for instance, the $^{31}$P-nuclei or $^{13}$C-nuclei, of which relatively little occurs in the human body as compared to the $^1$H-nuclei, are excited or their nuclear spin resonance signals are received, RF coils are known which, for reasons of sufficient sensitivity, are arranged in regions of a body close to the surface, i.e., are placed in particular on the surface of the body. As RF coils suitable for this purpose, which therefore are also called surface coils, circular windings with a single or several turns are generally used. See the papers mentioned above.

The sensitivity maximum of such surface coils, however, is in regions close to the surface. If, however, parts of the body located deeper are specifically to be examined with these coils, in which their sensitivity is comparatively smaller, it cannot be avoided that the resonance signals to be obtained are always overlaid by relatively strong signals from the regions close to the surface. This makes the analysis of the signals more difficult, and often an unequivocal statement regarding the deeper parts of the body is impossible.

SUMMARY OF THE INVENTION

It is therefore an object of the present invention to improve the high-frequency device mentioned above in such a manner that the sensitivity of its surface coil can be adjusted in the depth direction so that relatively strong resonance signals, especially from the deeper parts of the body to be examined, can be obtained.

The above and other objects of the present invention are achieved by the provision that the surface coil has several turns which are arranged enclosing each other, at least partially, at different geometrical points, where each turn comprises, at least largely, a single conductor section or several conductor sections which are combined in a respective group, and the directions of current flow in adjacent turns are opposed to each other.

The advantages of the high-frequency device according to the invention are in particular that, with a suitable choice of the number of turns, their geometrical size and position as well as of the number of their conductor segments, a pronounced directional characteristic in the depth direction perpendicularly to the surface of the body to be examined can be obtained, i.e., characteristic zones of higher and lower sensitivity with respect to the body depth can be obtained.

Other advantages, features and embodiments of the high-frequency device according to the invention will be apparent from the detailed description which follow.

BRIEF DESCRIPTION OF THE DRAWINGS

The invention will be explained in more detail in the following detailed description with reference to the drawings, in which:

FIGS. 3 and 4 show, in a corresponding presentation, an RF surface coil for a device according to the invention, and the signal field strength relationships obtained for this coil;

FIG. 5 shows a sectional view along the lines V, V of FIG. 3; and

DETAILED DESCRIPTION

Figure 1:
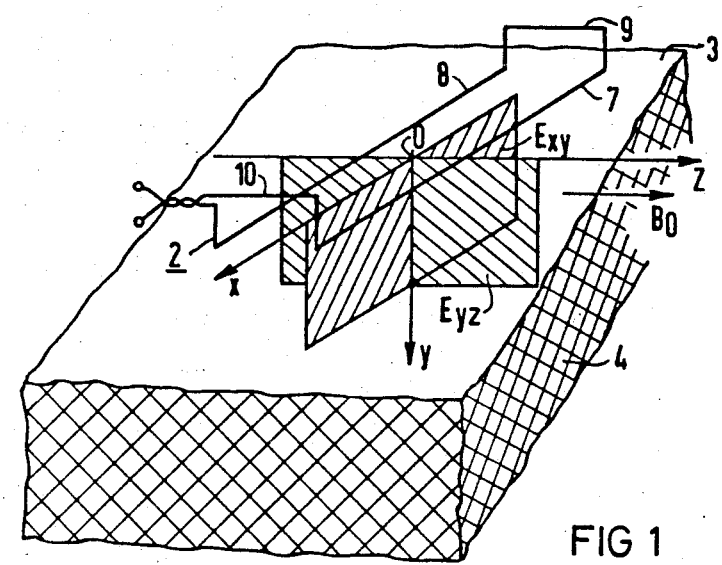
FIG. 1 shows schematically the arrangement of an RF surface coil.

With reference now to the drawings, FIG. 1 shows a surface coil as indicated in German Patent Application No. P 33 40 337.6 or copending U.S Patent Application Serial No. 665,355, filed Oct. 26, 1984. This coil, designated generally by 2, may have a single turn, the conductor parts of which are placed symmetrically with respect to a point 0 on the surface 3 of a body or part of a body 4 to be examined, at least partially. This part of the body is placed in a manner known per se in an at least partially homogeneous magnetic base field $B_0$ of a corresponding magnet of nuclear spin resonance apparatus, not shown in the figure. An orthogonal x-y-z coordinate system is placed through the point 0 in such a manner that the z-axis points in the direction of orientation of the magnetic base field $B_0$ In addition, the x-y plane and the y-z plane are illustrated in detail in the figure and are designated with $E_{xy}$ and $E_{yz}$. By means of a high-frequency a-c current I through the surface coil 2, a short-time RF field with a field strength $B_1$ which is required for such resonance experiments is then generated. The surface coil can serve also as a receiver for the RF signals to be received from the interior of the body part 4 after the RF field is shut off.

According to the embodiment chosen, the surface coil 2 has a rectangular shape. However, it can also have a round and, for instance, oval or circular shape. Due to the shape assumed in the figure, the coil 2 has two parallel longitudinal conductor sections 7 and 8, between which transverse conductor sections 9 and 10 extend. Coil 2 is aligned here relative to the magnetic base field $B_0$ in such a manner that its longitudinal conductor sections 7 and 8 extend at least approximately at right angles to this field. The transverse conductor sections 9 and 10 which are substantially shorter than the longitudinal conductor sections 7 and 8 are thus substantially parallel to this base field. Due to this alignment of the longitudinal conductor sections 7 and 8, it is advantageously achieved that the same field characteristic is developed approximately in each y-z cross-sectional plane for the radiation of the RF signals. The same applies also to the receiving case. It can then be achieved that the received RF signals can be assigned more unequivocally to a region which is limited by the geometric extent of the area between the longitudinal conductor sections of the coil.

Advantageously, the longitudinal conductor sections 7 and 8 are at least 3-times longer than the transverse conductor sections 9 and 10. In order to reduce end effects of coil 2, the transverse conductor sections 9 and 10 preferably are arranged above the body surface 3 so that they are located at a larger distance from the signal source in the body part 4 than, by comparison, the two longitudinal conductor sections 7 and 8. Besides this measure, shown in the figure, for reducing end effects, other measures can also be provided such as high-frequency shielding of the transverse conductor sections.

Figure 2:
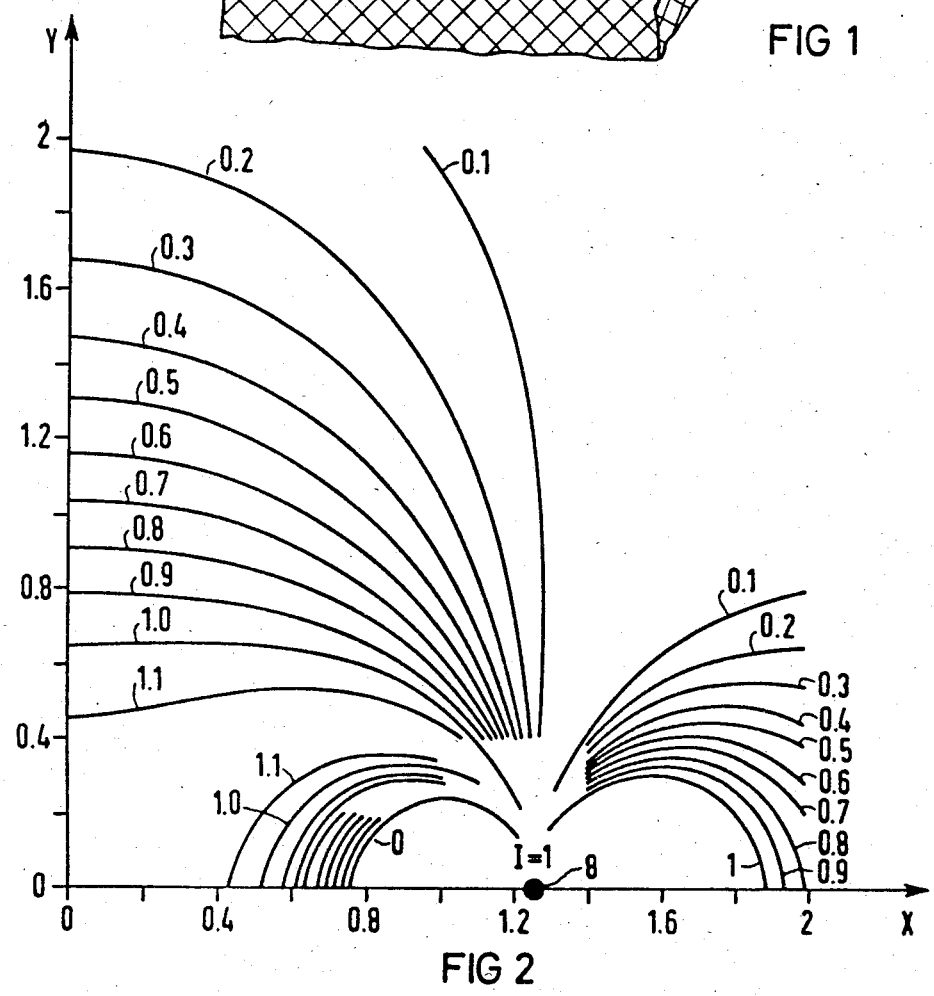
FIG. 2 is a diagram of the pattern of lines of constant RF signal field strength obtained for the coil of FIG. 1 in a specific cross-sectional plane.

Since the high-frequency a-c field of the surface coil 2 with the field strength $B_1$ is superimposed by the very substantially stronger magnetic base field $B_0$, it follows that the components of the very much weaker high-frequency a-c field which agree with the orientation direction of the base field $B_0$, are practically ineffective. For the RF signals which are to be received by the surface coil 2, a pattern of lines of constant effective signal strength is then obtained, for instance, in the transversal x-y plane $E_{xy}$, as shown in the diagram of FIG. 2. In this diagram, with location coordinates in arbitrary units, the relative signal strength ratios of the received RF signals to be determined are entered alongside the respective curves. The signal strength is determined after a 90° impulse as the product of $B_1$ and sin (constant·$B_1$).

As apparent from the diagram of FIG. 2, the region of greatest signal strength and therefore maximum sensitivity lies at relatively small y-values, i.e., in the vicinity of the surface 3 of the body part 4 to be examined. The difficulties connected with respect to the examination of deeper body parts can be reduced substantially with the embodiment of the RF surface coil according to the invention. An embodiment of such a coil is shown in detail in FIG. 3 wherein parts agreeing with FIG. 1 are provided with the same reference symbols.

Figure 6:
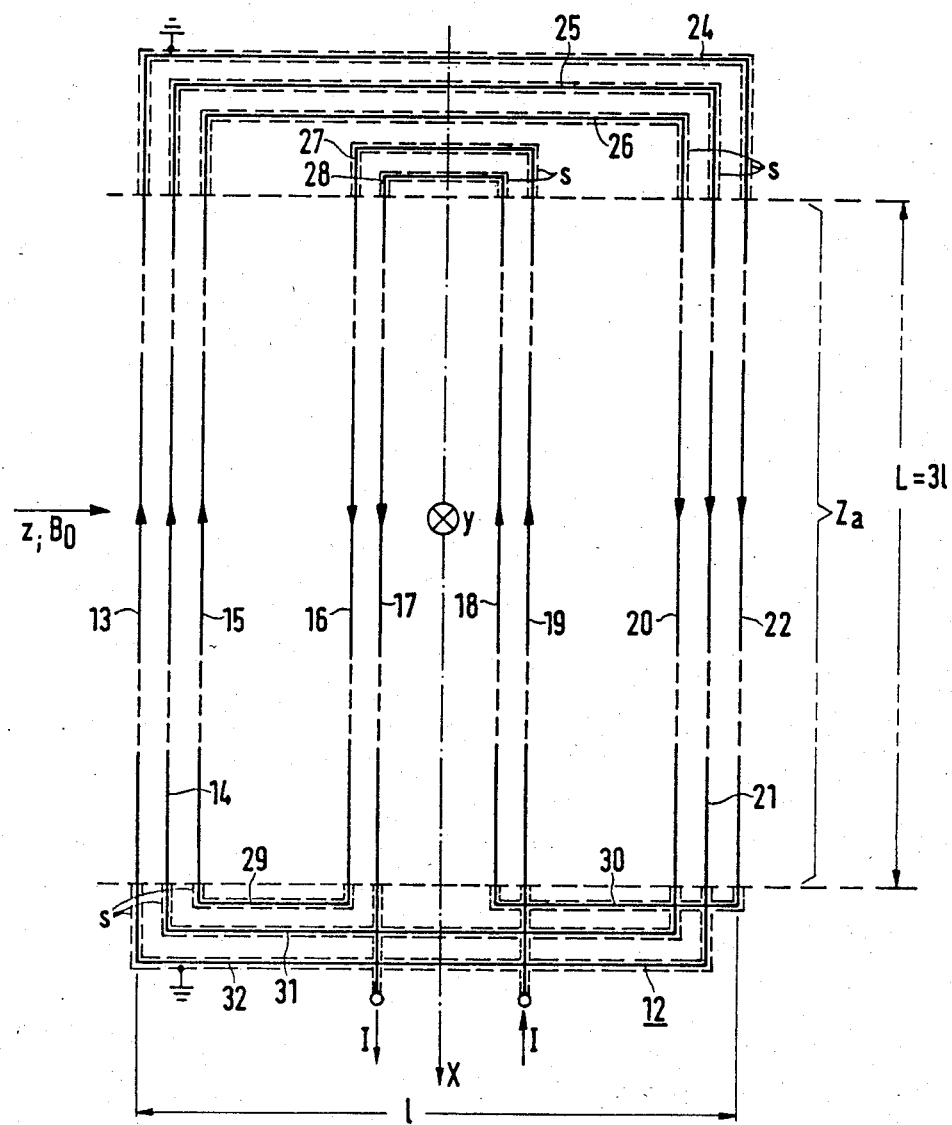
FIG. 6 shows an RF surface coil according to FIG. 3 provided with shielded transverse conductor sections.

To improve the directional characteristics with respect to the body depth, the surface coil according to the invention, as shown in FIG. 3, is designed so that it has several turns which each comprise either only a single conductive section or of conductor sections combined in groups. These turns should be arranged relative to each other in such a manner that they enclose each other, at least partially, and in addition are spaced from each other. In the embodiment of such a surface coil, generally designated with 12, as shown in FIG. 3, it was assumed that it is of rectangular shape. However, it may also have a round, i.e., oval or circular shape. The coil 12 is elongated in the x-direction, i.e., its longitudinal conductor sections 13 to 22, which are oriented, at least approximately, parallel to the x-axis, are substantially and preferably at least three-times longer than their respectively associated transverse conductor sections 24 to 32. In addition, the transverse conductor sections are either raised above the surface of the body part in accordance with FIG. 1, or are arranged shielded, so that, between two zones $Z_1$ and $Z_2$ with raised or shielded conductor sections, the surface coil 12 rests on the body surface only with its longitudinal conductor sections 13 to 22 in an active zone $Z_a$. According to the definition herein, this includes the arrangement of the longitudinal conductor sections 13 to 22 directly on the body surface 3 as well as at a small distance of, for instance, several centimeters above it. FIG. 6 shows the arrangement of FIG. 3 wherein the transverse conductor sections 24–32 are shielded by coaxial cables having grounded cable jackets.

The active parts of the individual turns of the surface coil 12 are formed by longitudinal conductor sections having the same direction of current flow, which are combined in groups and are arranged directly adjacent or on top of each other. Thus, the coil contains two groups $G_1$ and $G_1'$ comprising the longitudinal conductor sections 16 and 17, 18 and 19, respectively, which are arranged symmetrically with respect to the x-axis and spaced from the latter by an average distance $d_1$. The number of longitudinal conductor sections in these groups is designated with $n_1$. The longitudinal conductor sections 16 to 19 form a quasi winding section 35 which is indicated by a dotted line and is enclosed by an outer winding section. The active part of this outer winding section is formed by two groups $G_2$ and $G_2'$ with the respective longitudinal conductor sections 13 to 15 and 20 to 22, respectively. The average distance of these groups containing $n_2 = 3$ longitudinal conductor sections from the x-axis is designated with $d_2$. The individual longitudinal conductor sections 13 to 22 are connected via the transverse conductor sections 24 to 32 in such a manner that the current flow directions through the longitudinal conductor sections of each individual group indicated by arrows are equal but that mutually adjacent groups have opposite current flow directions.

It is also important for the surface coil 12 according to FIG. 3 that the dimension L of the active zone $Z_a$ is chosen considerably larger in the x-direction than the distance $d_2$ or $d_1$, respectively. It can thus be assured that practically only the y-component of the high-frequency a-c field $B_1$ is effective. In addition, the active lengths of the individual groups can optionally have different sizes in the direction of the x-axis, i.e., the active length of the groups $G_1$ and $G_1'$ can, for instance, be larger or smaller than the active length of the groups $G_2$ and $G_2'$. If, furthermore, the distances $d_1$ and $d_2$ are chosen so that their ratio to the conductor numbers $n_1$ and $n_2$ is $d_1/d_2 = n_1/n_2$, it is advantageous if the field in the center of the arrangement, i.e., at the coordinate origin, is practically completely extinguished and the zone of maximum sensitivity is relocated deeper in the interior of the body, i.e., the field strength has in the vicinity of this depth the form of a saddle point which in this case is located approximately at $(d_1+d_2)/4$. In this manner, more unambiguous statements about body parts located more deeply in the body such as internal organs can be obtained, for instance, in the field of medical engineering.

Figure 4:
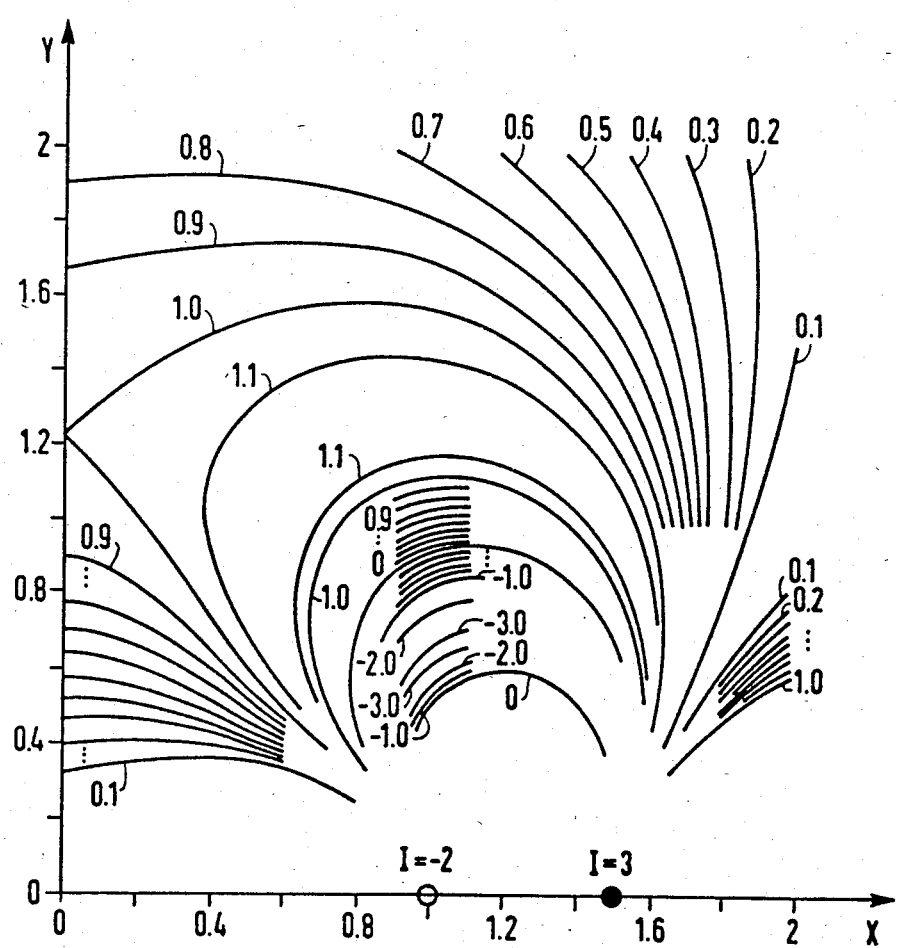

A similar embodiment of a surface coil according to the invention with $n=2$ longitudinal conductor sections each per group is assumed in the diagram of FIG. 4. In this diagram are plotted, in a manner corresponding to the presentation of the diagram according to FIG. 2, the curves of constant signal strength in a section in the x-y plane. As can be ascertained from the diagram, especially by comparison with the diagram of FIG. 2, the sensitivity maximum now is located not near the x-axis for relatively small y-values, but it is shifted toward larger y-values. This shift is equivalent to the shift of the sensitivity maximum toward respectively greater body depths.

In the embodiment of a surface coil according to FIG. 3, it was assumed that the longitudinal conductor sections of its individual conductor groups are all to be located in the x-z plane on the surface 3 of the body part 4 to be examined. Such an arrangement, however, is not absolutely necessary because, as can be seen from the cross section in a y-z plane schematically shown in FIG. 5, the longitudinal conductor sections belonging to the respective groups can also lie in different planes. For example, as shown in FIG. 5, the conductor sections of groups $G_1$ and $G_1'$ lie in a different plane than the conductor sections of groups $G_2$ and $G_2'$. Groups $G_2$ and $G_2'$ lie in a plane indicated by the dashed lines E and groups $G_1$ and $G_1'$ are located on the surface of the body to be examined or at a small distance therefrom.

In addition to the embodiment of the surface coil 12 according to FIG. 3 having two pairs of conductor groups $G_1$–$G_1'$ or $G_2$–$G_2'$, coils can naturally also be provided which have groups of longitudinal conductor sections which are further removed from the x-axis. The number n of longitudinal conductor sections of these farther removed groups need not increase continuously with increasing distance from the x-axis. In general, however, it is advantageous that, at least for the two groups $G_1$ and $G_2$ or $G_1'$ and $G_2'$, respectively, which are nearest to the x-axis, the number of their longitudinal conductor sections increases, i.e., that $n_2 > n_1$.

Besides the special series connection indicated in FIG. 3, of the individual longitudinal conductor sections, a parallel connection of individual coils is in principle also conceivable. However, it should be noted here that, with an inhomogeneous structure of the body part to be examined, an asymmetrical subdivision of the current over the individual coils can also occur.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than a restrictive sense.

What is claimed is:

1. Apparatus for at least one of generating a magnetic high-frequency field and receiving corresponding high-frequency signals in nuclear spin resonance apparatus, comprising high-frequency surface coil means arranged within an at least partially homogeneous magnetic field region of a magnetic field generated by a base field magnet means, said magnetic field having a predetermined orientation direction, said surface coil means being disposed either directly on one side of a surface of a body to be examined, or at least in the vicinity of said one side of said surface and generating an inhomogeneous magnetic field in said body, said surface coil means having a substantially rectangular shape and having a plurality of turn parts which are arranged at different geometric locations and which form a plurality of turns at least partially enclosing each other, each turn comprising a plurality of longitudinal conductor sections and a plurality of transverse conductor sections which connect said longitudinal conductor sections at least partially together, said longitudinal conductor sections being arranged substantially perpendicular to the orientation direction of said magnetic field of the base field magnet means, the directions of current flow in parallel extending ones of the longitudinal conductor sections of adjacent turn parts being opposed to each other.

2. The apparatus recited in claim 1 wherein each turn part comprises a group of conductor sections, the direction of current flow in each conductor section in a group being the same.

3. The apparatus recited in claim 2, wherein said turn parts of the surface coil means form at least two turns which at least partially enclose each other and defining an outer and an inner turn, and wherein a number $n_1$ of the conductor sections of the inner turn is smaller than a number $n_2$ of the conductor sections of the outer turn enclosing the inner turn.

4. The apparatus recited in claim 2 wherein said coil means comprises two pairs of groups of longitudinal conductor sections arranged symmetrically about a plane of symmetry, one pair comprising a first turn and the other pair comprising a second turn, said plane being arranged substantially perpendicular to the orientation direction of said magnetic field of the base field magnet means.

5. The apparatus recited in claim 4 wherein one of said pairs of groups is located closer to the plane of symmetry, each group of said pair having two longitudinal conductor sections and the other pairs of groups is further removed from the plane of symmetry, each group of said further removed pair having three longitudinal conductor sections.

6. The apparatus recited in claim 5 wherein a distance $d_1$ from the plane of symmetry to of the groups located closer to the plane of symmetry, is chosen relative to a corresponding distance $d_2$ of the further removed groups so that at least approximately the following relation applies: $d_1/d_2 = n_1/n_2$.

7. The apparatus recited in claim 2 wherein the groups of conductor sections are arranged at least partially in different planes.

8. The apparatus recited in claim 1, wherein said longitudinal conductor sections are substantially longer than the transverse conductor sections.

9. The apparatus recited in claim 8 wherein each turn part comprises a group of conductor sections, the direction of current flow in each conductor section in a group being the same.

10. The apparatus recited in claim 8 wherein the minimum length of the longitudinal conductor sections is at least three times longer than the length of the transverse conductor sections.

11. The apparatus recited in claim 8 further comprising means for shielding the transverse conductor sections from external high-frequency signals.

12. The apparatus recited in claim 8 wherein the transverse conductor sections are arranged at a greater distance from the surface of the body to be examined than the longitudinal conductor sections.

13. The apparatus recited in claim 1, wherein said turn parts of the surface coil means form at least two turns which at least partially enclose each other defining an outer and an inner turn.

* * * * *